United States Patent
Masuda et al.

(10) Patent No.: US 10,546,820 B2
(45) Date of Patent: Jan. 28, 2020

(54) RADIO FREQUENCY MODULE AND METHOD FOR MANUFACTURING THE SAME

(71) Applicant: Murata Manufacturing Co., Ltd, Kyoto (JP)

(72) Inventors: Yoshihisa Masuda, Kyoto (JP); Ryoichi Kita, Kyoto (JP); Issei Yamamoto, Kyoto (JP); Katsuki Nakanishi, Kyoto (JP); Yukio Nakazawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 57 days.

(21) Appl. No.: 15/852,019

(22) Filed: Dec. 22, 2017

(65) Prior Publication Data
US 2018/0190595 A1 Jul. 5, 2018

Related U.S. Application Data

(63) Continuation of application No. PCT/JP2016/069066, filed on Jun. 28, 2016.

(30) Foreign Application Priority Data

Jun. 30, 2015 (JP) .................................. 2015-130858

(51) Int. Cl.
*H01L 23/552* (2006.01)
*H01L 21/56* (2006.01)
(Continued)

(52) U.S. Cl.
CPC .......... *H01L 23/552* (2013.01); *H01L 21/565* (2013.01); *H01L 23/3114* (2013.01);
(Continued)

(58) Field of Classification Search
CPC combination set(s) only.
See application file for complete search history.

(56) References Cited

U.S. PATENT DOCUMENTS 8,890,309 B1 * 11/2014 Mugiya ................. H01L 23/552
257/704
2012/0000699 A1 1/2012 Inoue
(Continued)

FOREIGN PATENT DOCUMENTS

CN 104347540 A 2/2015
JP 2010-225620 A 10/2010
(Continued)

OTHER PUBLICATIONS

International Search Report for Application Serial No. PCT/JP2016/069066 dated Aug. 30, 2016.
(Continued)

*Primary Examiner* — Hoang-Quan T Ho
*Assistant Examiner* — Jordan M Klein
(74) *Attorney, Agent, or Firm* — Pearne & Gordon LLP

(57) ABSTRACT

A radio frequency module includes a wiring substrate, a plurality of components mounted on an upper surface of the wiring substrate, a sealing resin layer laminated on the upper surface of the wiring substrate and covering the plurality of components, a groove formed in an upper surface of the sealing resin layer and extending between predetermined components of the plurality of components, and a shielding wall made of conductive paste in the groove. The sealing resin layer has a stepped area defining the higher portion and lower portion in the upper surface. The groove intersects the stepped area when the wiring substrate is seen in plan view.

19 Claims, 7 Drawing Sheets

(51) Int. Cl.
*H01L 23/31* (2006.01)
*H01L 23/538* (2006.01)
*H01L 23/66* (2006.01)
*H01L 21/48* (2006.01)

(52) U.S. Cl.
CPC ............ *H01L 23/538* (2013.01); *H01L 23/66* (2013.01); *H01L 21/4853* (2013.01)

(56) References Cited

U.S. PATENT DOCUMENTS

| | | | | |
|---|---|---|---|---|
| 2012/0140423 | A1* | 6/2012 | Fisher, Jr. | H05K 3/284 |
| | | | | 361/748 |
| 2014/0146495 | A1* | 5/2014 | Fisher, Jr. | H05K 3/284 |
| | | | | 361/753 |
| 2015/0043172 | A1 | 2/2015 | Mugiya et al. | |
| 2015/0044822 | A1* | 2/2015 | Mugiya | H01L 23/552 |
| | | | | 438/124 |
| 2015/0062835 | A1* | 3/2015 | Kai | H01L 23/3121 |
| | | | | 361/748 |
| 2016/0149300 | A1* | 5/2016 | Ito | H01Q 23/00 |

FOREIGN PATENT DOCUMENTS

| | | |
|---|---|---|
| JP | 5622906 B1 | 11/2014 |
| JP | 2015-053297 A | 3/2015 |

OTHER PUBLICATIONS

Written Opinion for Application Serial No. PCT/JP2016/069066 dated Aug. 30, 2016.

* cited by examiner

RADIO FREQUENCY MODULE AND METHOD FOR MANUFACTURING THE SAME

This is a continuation of International Application No. PCT/JP2016/069066, filed on Jun. 28, 2016 which claims priority from Japanese Patent Application No. JP 2015-130858 filed on Jun. 30, 2015. The contents of these applications are incorporated herein by reference in their entireties.

BACKGROUND

Technical Field

The present disclosure relates to a radio frequency module including a sealing resin layer covering a plurality of components mounted on a wiring substrate and a shielding wall for preventing mutual interference of noise between the components and to a method for manufacturing the same.

A radio frequency module implemented in a mobile terminal device or other similar device may include a shield layer for blocking electromagnetic waves. In the radio frequency module of this type, a component mounted on a wiring substrate may be covered with sealing resin, and the surface of the sealing resin may be covered with the shield layer.

The shield layer is disposed to block noise from the outside. When a plurality of components is mounted on the wiring substrate, there is a problem in that noise from any of the components interferes with the other components. To address this problem, a radio frequency module including a shield for not only blocking noise from the outside but also mutually blocking noise between mounted components has been proposed.

One such example is described in Patent Document 1 and illustrated as a radio frequency module 100 in FIG. 10. In the radio frequency module 100, a plurality of components 102 are mounted on a wiring substrate 101, and the components 102 are covered with a sealing resin layer 103. The sealing resin layer 103 has a trench 104 (groove) extending between predetermined components in its upper surface. A shield layer 105 covers the surface of the sealing resin layer 103 and is made of a conductive resin charged in the trench 104. The shield layer 105 is connected to a surface conductor 106 on the wiring substrate 101 at the bottom portion of the trench 104. The surface conductor 106 is electrically connected to a ground terminal in the radio frequency module 100.

With this configuration, the components 102 can be shielded against noise from the outside by the conductive resin covering the surface of the sealing resin layer 103. The mutual interference of noise between predetermined components can also be prevented by the conductive resin charged in the trench 104.

Patent Document 1: Japanese Patent No. 5622906 (see paragraphs 0030 to 0040 and FIG. 4 and the like)

BRIEF SUMMARY

However, in the traditional radio frequency module 100, because the surface of the sealing resin layer 103 is flat, for example, if the components 102 mounted on the wiring substrate 101 have different thicknesses, the sealing resin layer 103 contains an unnecessary portion on a thinner component 102. In recent years, there has been a demand to reduce such an unnecessary portion and miniaturize the radio frequency module 100. To miniaturize the radio frequency module 100, it is also desired that the degree of freedom of arrangement of the components 102 be improved.

In light of the above problems, the present disclosure reduces an unnecessary portion of a radio frequency module by having a stepped area in a surface of a sealing resin layer and to improve the degree of freedom of arrangement of mounted components by arranging a shielding wall so as to intersect the stepped area.

A radio frequency module according to the present disclosure includes a wiring substrate, a plurality of components mounted on a principal surface of the wiring substrate, a sealing resin layer laminated on the principal surface of the wiring substrate and covering the plurality of components, a groove formed in the sealing resin layer and extending between a predetermined component and another component of the plurality of components, and a shielding wall made of a conductor and arranged in the groove. The sealing resin layer has a stepped area in an opposite surface opposed to a surface on the principal surface of the wiring substrate. The groove intersects the stepped area when the wiring substrate is seen in plan view (viewed in a direction perpendicular to the principal surface of the wiring substrate).

According to this configuration, because the opposite surface of the sealing resin layer has the stepped area, for example, when a thicker component of the plurality of components is arranged on the higher portion side of the stepped area in the sealing resin layer and a thinner component is arranged on the lower portion side in the sealing resin layer, an unnecessary portion of the sealing resin layer can be reduced. Because the shielding wall is arranged so as to intersect the stepped area in the sealing resin layer, the degree of freedom of arrangement of components mounted on the principal surface of the wiring substrate can be improved.

The shielding wall may include a first portion in which a portion of the groove on a higher portion side of the stepped area in the sealing resin layer, the portion ending before the stepped area and not reaching the stepped area, is filled with the conductor up to a height of the higher portion and a second portion in which a remaining portion of the groove on the higher portion side of the stepped area is filled with the conductor up to a height of a lower portion of the stepped area, and the groove may have an unfilled region not filled with the conductor, the unfilled region being defined by a stepped area of the first portion and the second portion of the shielding wall.

When the shielding wall is formed by filling the groove with conductive paste, in filling the groove on the higher portion side with the conductive paste, there is a risk of leakage of the conductive paste to the lower portion side of the stepped area. With the above-described configuration, because the first portion of the shielding wall with the height of the higher portion side of the sealing resin layer ends before the stepped area, the leakage of the conductive paste can be reduced.

The radio frequency module may further include a shielding film for covering at least the opposite surface of the sealing resin layer and a wall surface defining the unfilled region of the groove. In this case, because the wall surface defining the unfilled region of the groove is covered with the shielding film, the shielding characteristics between the components can be improved.

The unfilled region of the groove may be wider than a portion of the groove other than the unfilled region. With this configuration, for example, in forming the shielding film by using a film deposition technique, the shielding film can easily move over the wall surface defining the unfilled region of the groove, and the wall surface can be covered with reliability.

The shielding wall may be formed by fully filling the groove with the conductor. In this case, because it is not necessary to cover the wall surface defining the groove with the shielding film, the shielding film can be easily formed.

The stepped area may be inclined from the higher portion toward the lower portion. In this case, for example, in forming the stepped area by using a mold, the sealing resin layer can be removed from the mold smoothly.

The stepped area may have a shape in which a stepped corner portion is chamfered. In this case, the variety of the shape of the stepped area in the sealing resin layer can be increased.

The groove and the stepped area may obliquely intersect each other in the plan view. With this configuration, the degree of freedom in design of the radio frequency module, such as the degree of freedom of arrangement of the components, can be improved.

The stepped area in the sealing resin layer may be curved in the plan view. In this case, the degree of freedom in design of the radio frequency module can be improved.

The radio frequency module may include a shielding film for covering at least the opposite surface of the sealing resin layer, the shielding wall may include a portion on a higher portion side of the stepped area and a portion on a lower portion side thereof, both of the portions being arranged separately, and the shielding film may further cover a wall surface defining the groove between the portion on the higher portion side and the portion on the lower portion side of the shielding wall. In this case, because the shielding wall is formed such that the portion on the higher portion side and the portion on the lower portion side are arranged separately, the shielding wall intersecting the stepped area in the sealing resin layer can be easily formed. The wall surface defining the groove between both of the portions of the shielding wall is covered with the shielding film, and thus the shielding characteristics between the components in the radio frequency module can be ensured.

A method for manufacturing a radio frequency module according to the present disclosure includes a preparation step of preparing a component-sealed structure including a wiring substrate, a plurality of components mounted on a principal surface of the wiring substrate, and a sealing resin layer laminated on the principal surface of the wiring substrate and covering the plurality of components, the sealing resin layer having a stepped area in an opposite surface opposed to a surface in contact with the principal surface of the wiring substrate, a shielding wall forming step of forming a groove in the sealing resin layer, the groove extending between a predetermined component and another component of the plurality of components and intersecting the stepped area when the wiring substrate is seen in plan view, and of forming a shielding wall in the groove, and a shielding film forming step of forming a shielding film that covers at least the opposite surface of the sealing resin layer by using a film deposition technique. The shielding wall forming step includes a first step of forming a section of the groove in the opposite surface of the sealing resin layer on a higher portion side of the stepped area by laser processing, the section extending to near the stepped area, a second step of forming a first portion of the shielding wall by filling the section of the groove formed in the first step with conductive paste, a third step of forming a remaining portion of the groove by laser processing, and a fourth step of forming a second portion of the shielding wall by inserting the conductive paste into the remaining portion of the groove up to a height of a lower portion side of the stepped area in the sealing resin layer and of forming an unfilled region not filled with the conductive paste in the groove. In the shielding film forming step, the shielding film covers a wall surface defining the unfilled region of the groove, together with the opposite surface of the sealing resin layer.

For example, if all of the groove intersecting the stepped area in the sealing resin layer is formed at a time, in filling the groove on the higher portion side with conductive paste, there is a risk of leakage of the conductive paste to the lower portion side. With the above-described configuration, because the first portion of the shielding wall is produced by forming a section of the groove on the higher portion side in the first step and then filling the section with the conductive paste in the second step, the conductive paste charged in the groove on the higher portion side can be prevented from leaking to the lower portion side of the sealing resin layer. In the third and fourth steps, when the remaining second portion of the shielding wall is formed, the unfilled region, which is empty of the conductive paste, is formed in the groove, and the wall surface defining the unfilled region of the groove is covered with the shielding film. Accordingly, the radio frequency module capable of preventing a defect of leakage of the conductive paste on the higher portion side of the stepped area to the lower portion side when the shielding wall intersecting the stepped area in the sealing resin layer is formed and capable of ensuring the shielding characteristics between the components can be manufactured.

Another method for manufacturing a radio frequency module according to the present disclosure includes a preparation step of preparing a component-sealed structure including a wiring substrate, a plurality of components mounted on a principal surface of the wiring substrate, and a sealing resin layer laminated on the principal surface of the wiring substrate and covering the plurality of components, the sealing resin layer having a stepped area in an opposite surface opposed to a surface in contact with the principal surface of the wiring substrate, a shielding wall forming step of forming a groove in the sealing resin layer, the groove extending between a predetermined component and another component of the plurality of components and intersecting the stepped area when the wiring substrate is seen in plan view, and of forming a shielding wall in the groove, and a shielding film forming step of forming a shielding film that covers at least the opposite surface of the sealing resin layer by using a film deposition technique. The shielding wall forming step includes a fifth step of forming a portion of the groove extending to near the stepped area on a higher portion side of the stepped area and a portion of the groove extending to near the stepped area on a lower portion side of the stepped area by laser processing, a sixth step of forming the shielding wall including a portion on the higher portion side of the sealing resin layer and a portion on the lower portion side thereof, both of the portions being arranged separately, by filling the portion of the groove extending to near the stepped area on the higher portion side and the portion of the groove extending to near the stepped area on the lower portion side with conductive paste, and a seventh step of forming a remaining portion of the groove other than the portions formed in the fifth step by laser processing. In the shielding film forming step, the shielding film covers a wall surface defining the remaining portion of the groove, together with the opposite surface of the sealing resin layer.

In this case, because the shielding wall is formed such that the portion on the higher portion side of the sealing resin layer and the portion on the lower portion side thereof are arranged separately, a defect of leakage of the conductive paste charged in the groove to the lower portion side that would occur when all of the groove intersecting the stepped area in the sealing resin layer is formed at a time can be prevented. Because the portion on the higher portion side and the portion on the lower portion side of the shielding wall can be formed at a time, the number of steps of charging the conductive paste can be reduced. The wall surface defining the groove between both the portions is covered with the shielding film. Accordingly, the radio frequency module capable of preventing a defect of leakage of the conductive paste charged on the higher portion side of the stepped area to the lower portion side when the shielding wall intersecting the stepped area in the sealing resin layer and capable of ensuring the shielding characteristics between the components can be manufactured.

According to the present disclosure, because the sealing resin layer has the stepped area in its opposite surface, for example, when a thicker component of the plurality of components is arranged on the higher portion side of the stepped area in the sealing resin layer and a thinner component is arranged on the lower portion side thereof, an unnecessary portion in the sealing resin layer can be reduced. Because the shielding wall intersects the stepped area in the sealing resin layer, the degree of freedom of arrangement of components mounted on the principal surface of the wiring substrate can be improved.

DETAILED DESCRIPTION

<First Embodiment>

Figure 1:
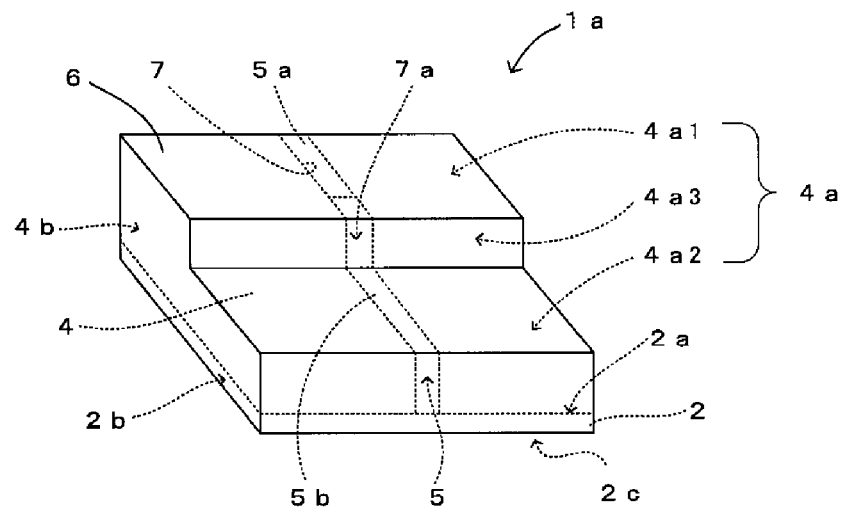
FIG. 1 is a perspective view of a radio frequency module according to a first embodiment of the present disclosure.
Figure 2:
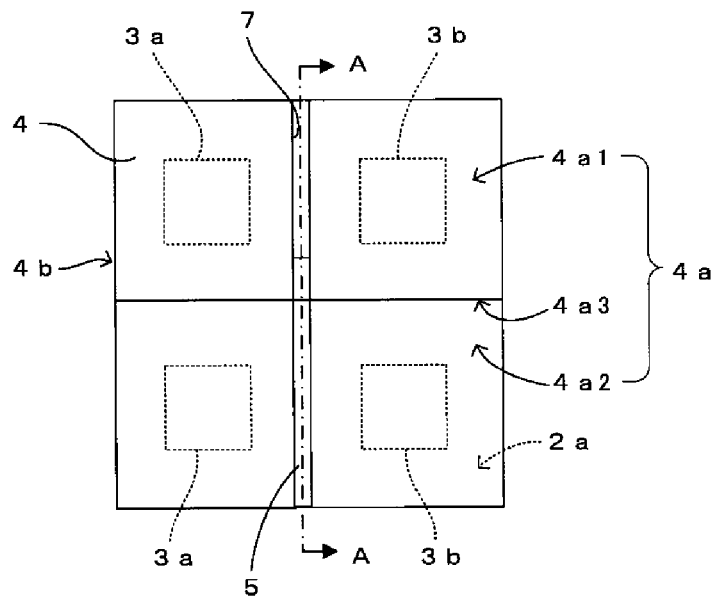
FIG. 2 is a plan view of the radio frequency module illustrated in FIG. 1.

A radio frequency module according to a first embodiment of the present disclosure is described with reference to FIGS. 1 and 2. FIG. 1 is a perspective view of the radio frequency module. FIG. 2 is a plan view of the radio frequency module. In FIG. 2, a shielding film is not illustrated.

A radio frequency module 1a according to this embodiment includes a wiring substrate 2, a plurality of components 3a and 3b mounted on an upper surface 2a of the wiring substrate 2, a sealing resin layer 4 laminated on the upper surface 2a of the wiring substrate 2, a shielding film 6 covering the surface of the sealing resin layer 4, and a shielding wall 5 inside the sealing resin layer 4, as illustrated in FIGS. 1 and 2. The radio frequency module 1a may be implemented on a mother board or other similar element in an electronic device that uses radio frequency signals.

One example of the wiring substrate 2 may be made of a low temperature co-fired ceramic, glass epoxy resin, or other similar material. Mounting electrodes (not illustrated) for mounting of the components 3a and 3b and a surface-layer conductor (not illustrated) for connection to the shielding wall 5 are disposed on the upper surface 2a of the wiring substrate 2 (corresponding to "principal surface of the wiring substrate" in the present disclosure), and an outer electrode (not illustrated) for outer connection is disposed on a lower surface 2c. Various wiring electrodes (not illustrated) and via conductors (not illustrated) are disposed inside the wiring substrate 2. The surface-layer conductor is electrically connected to a ground electrode (wiring electrode) disposed inside the wiring substrate 2. The wiring substrate 2 may have a single-layer structure or a multilayer structure.

The mounting electrodes, surface-layer conductor, outer electrode, and wiring electrodes are made of a metal generally used in wiring electrodes, such as copper, silver, or aluminum. The via conductors are made of a metal, such as silver or copper. One example of the surface-layer conductor connected to the shielding wall 5 may be overlaid with a metal member for protecting the surface-layer conductor, such as a solder film.

Each of the components 3a and 3b is configured as a semiconductor element made of a semiconductor, such as silicon or gallium arsenide, or a chip component, for example, a chip inductor, a chip capacitor, or a chip resistor.

The sealing resin layer 4 is laminated on the wiring substrate 2 so as to cover the upper surface 2a of the wiring substrate 2 and the components 3a and 3b. The sealing resin layer 4 can be made of a resin generally used as sealing resin, such as epoxy resin. In the present embodiment, the sealing resin layer 4 has a stepped area defining higher and lower portions in an upper surface 4a being an opposite surface opposed to a surface in contact with the wiring substrate 2. The stepped area includes a higher surface 4a1 and a lower surface 4a2, which are substantially parallel with each other, and a stepped surface 4a3, which extends in a direction perpendicular to the surfaces 4a1 and 4a2 and links both of these surfaces together.

The shielding wall 5 is made of a conductor inside a groove 7 in the upper surface 4a of the sealing resin layer 4. Specifically, as illustrated in FIGS. 1 and 2, the groove 7 intersecting the stepped area in the sealing resin layer 4 and extending between the predetermined components 3a and 3b is disposed in the upper surface 4a of the sealing resin layer 4, and the shielding wall 5 is formed by arranging the conductor in the groove 7. The groove 7 according to the present embodiment passes through the sealing resin layer 4 in the thickness direction over its full length so as to allow the surface-layer conductor on the upper surface 2a of the wiring substrate 2 and the shielding wall 5 inside the groove 7 to be connected to each other. The upper end portion of the shielding wall 5 is electrically connected to the top surface of the shielding film 6, which is described below.

The shielding wall 5 includes a higher portion 5a (corresponding to "first portion of the shielding wall" in the present disclosure) in which a portion of the groove on a higher portion side (higher surface 4a1) of the stepped area in the sealing resin layer 4, the portion ending before the stepped area and not reaching the stepped area, is filled with a conductor (conductive paste) up to the height of the higher surface 4a1 and a lower portion 5b (corresponding to "second portion of the shielding wall" in the present disclosure) in which the remaining portion of the groove 7 is filled with the conductor up to the height of the lower surface 4a2. Here, the stepped area formed by the higher portion 5a and lower portion 5b of the shielding wall 5 defines an unfilled region 7a which is not filled with the conductor in the groove 7 on the higher portion side of the sealing resin layer 4. One example of the shielding wall 5 can be made of conductive paste containing a metal filler of any of copper, silver, and aluminum.

The shielding film 6 is used for shielding various wiring electrodes inside the wiring substrate 2 and the components 3a and 3b against noise from the outside and is laminated on the sealing resin layer 4 so as to cover the upper surface 4a and a peripheral side surface 4b of the sealing resin layer 4 and a side surface 2b of the wiring substrate 2. The shielding film 6 is connected to a ground electrode (not illustrated) exposed at the side surface 2b of the wiring substrate 2.

The shielding film 6 can have a multilayer structure including a close contact film laminated on the surface of the sealing resin layer 4, a conductive film laminated on the close contact film, and a protective film laminated on the conductive film.

The close contact film is disposed to increase the strength of the close contact between the conductive film and the sealing resin layer 4, and one example of the close contact film can be made of a metal, such as stainless steel. The conductive film is a layer for practically performing the shielding function of the shielding film 6, and one example of the conductive film can be made of any metal of copper, silver, and aluminum. The protective film is disposed to prevent the conductive film from corrosion or damage, and one example of the protective film can be made of stainless steel.

(Method for Manufacturing Radio Frequency Module)

Next, a method for manufacturing the radio frequency module 1a is described with reference to FIGS. 3A to 3E. FIGS. 3A to 3E are cross-sectional views taken along the line A-A with arrows in FIG. 2 and illustrate steps in the method for manufacturing the radio frequency module 1a.

First, the wiring substrate 2 with the mounting electrodes for mounting of the components 3a and 3b, the surface-layer conductor to be connected to the shielding wall 5, various wiring electrodes, and via conductors is prepared by a known method.

Next, the components 3a and 3b are mounted on the upper surface 2a of the wiring substrate 2 by a known surface mount technology, such as solder mounting.

Next, the sealing resin layer 4 is laminated on the upper surface 2a of the wiring substrate 2 so as to cover the components 3a and 3b, and a component-sealed structure is formed (preparation step). At this time, a stepped area is formed in the upper surface 4a of the sealing resin layer 4. One example of the sealing resin layer 4 may be formed by transfer molding, compression molding, or other similar method.

Figure 3A:
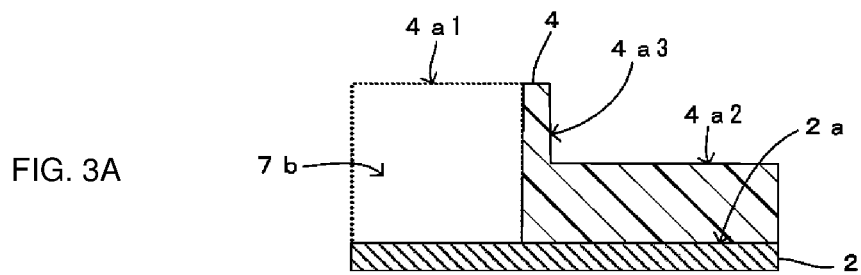
FIGS. 3A to 3E include illustrations for describing a method for manufacturing the radio frequency module illustrated in FIG. 1.

Next, the shielding wall 5 is formed between the predetermined components 3a and 3b in the sealing resin layer 4 (shielding wall forming step). In forming the shielding wall 5, the higher portion 5a and lower portion 5b are arranged separately. Specifically, as illustrated in FIG. 3A, of the groove 7 on the higher portion side (higher surface 4a1) of the stepped area in the upper surface 4a of the sealing resin layer 4, a section 7b extending to near the stepped area is formed by laser processing (first step).

Figure 3B:
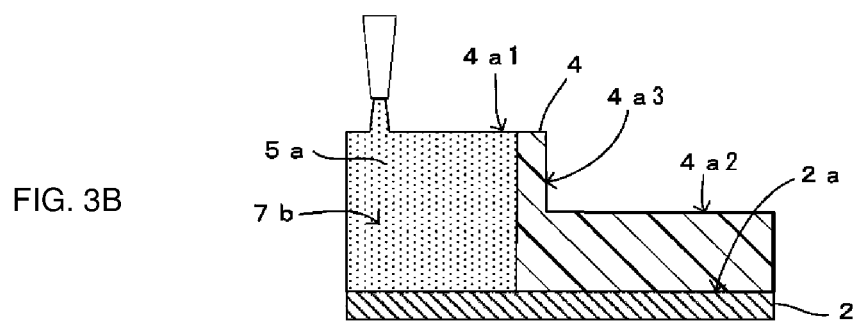

Next, as illustrated in FIG. 3B, after the section 7b in the groove 7 is filled with the conductive paste, the paste is solidified and the higher portion 5a of the shielding wall 5 is formed (second step). At this time, the higher portion 5a of the shielding wall 5 has substantially the same height as that of the higher surface 4a1 of the sealing resin layer 4. Because the section 7b in the groove 7 ends before the stepped area, the conductive paste charged into the higher portion 5a can be prevented from flowing out to the lower portion side (lower surface 4a2) of the sealing resin layer 4.

Figure 3C:
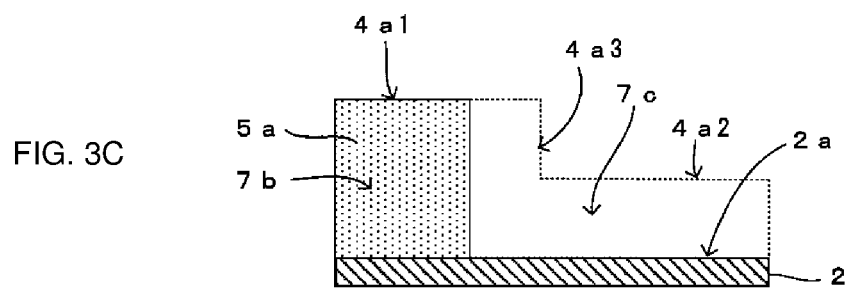

Next, as illustrated in FIG. 3C, a remaining portion 7c of the groove 7 is formed by laser processing (third step). At this time, to reliably join the section 7b and remaining portion 7c in the groove 7 together, the higher portion 5a of the shielding wall 5 may be cut slightly.

Figure 3D:
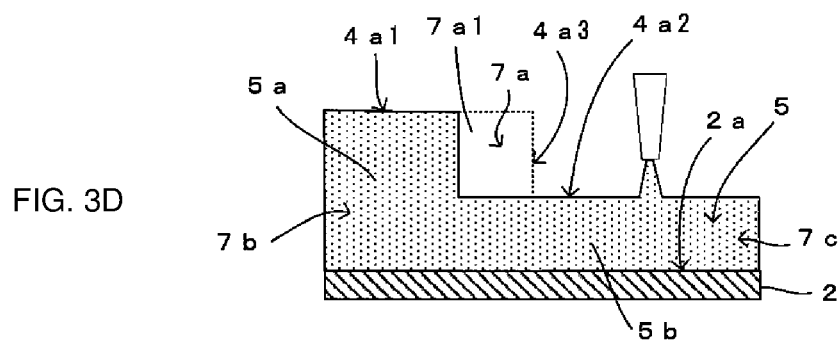

Next, as illustrated in FIG. 3D, the conductive paste is inserted into the remaining portion 7c of the groove 7 up to the height of the lower portion side (lower surface 4a2) of the sealing resin layer 4 and the lower portion 5b of the shielding wall 5 is formed, and the unfilled region 7a, which is not filled with the conductive paste, is formed in a portion of the groove 7 on the higher portion side of the sealing resin layer 4 (fourth step). In the fourth step, the higher portion 5a and lower portion 5b become connected, and all of the shielding wall 5 is completed. The unfilled region 7a in the groove 7 is formed by displacement of the position of the stepped area (portion where the higher portion 5a and lower portion 5b are connected) in the shielding wall 5 toward the higher portion side of the sealing resin layer 4 when the wiring substrate 2 is seen in plan view with reference to the position of the stepped area in the sealing resin layer 4.

Figure 3E:
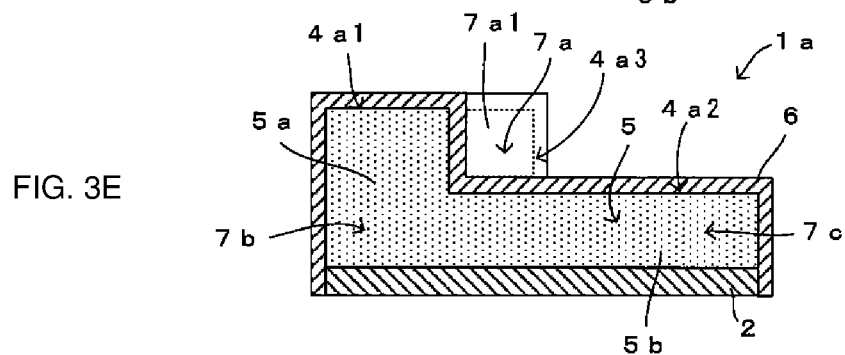

Next, as illustrated in FIG. 3E, the shielding film 6 for covering the upper surface 4a and peripheral side surface 4b of the sealing resin layer 4 and the side surface 2b of the wiring substrate 2 is formed by using a film deposition technique, for example, sputtering or vapor deposition, and the radio frequency module 1a is completed (shielding film forming step). At this time, a wall surface 7a1 defining the unfilled region 7a of the groove 7 is also covered.

According to the above-described embodiment, because the upper surface 4a of the sealing resin layer 4 has the stepped area, an unnecessary portion of the sealing resin layer 4 can be reduced by, for example, arranging a thicker component 3a or 3b of the plurality of components 3a and 3b on the higher portion side of the stepped area in the sealing resin layer 4 and arranging a thinner component 3a or 3b on the lower portion side of the sealing resin layer 4. Because the shielding wall 5 is arranged so as to intersect the stepped area in the sealing resin layer 4, the degree of freedom of arrangement of the components 3a and 3b mounted on the upper surface 2a of the wiring substrate 2 can be improved.

According to the method for manufacturing the radio frequency module 1a in the present embodiment, the groove 7 is formed such that the section 7b and remaining portion 7c are arranged separately, and thus the conductive paste charged in the groove 7 on the higher portion side of the sealing resin layer 4 can be prevented from flowing out to the lower portion side of the sealing resin layer 4. The higher portion 5a and lower portion 5b are arranged separately in the shielding wall 5, and the unfilled region 7a, which is not filled with the conductive paste, is present in the groove 7. Because the wall surface 7a1 defining the unfilled region 7a is covered with the shielding film 6, the shielding characteristics between the components 3a and 3b in the radio frequency module 1a can be ensured. Accordingly, the radio frequency module 1a capable of reducing its size by having the stepped area in the upper surface 4a of the sealing resin layer 4 and capable of improving the degree of freedom in design, such as the degree of freedom of arrangement of the components 3a and 3b, by arranging the groove 7 for forming the shielding wall 5 so as to intersect the stepped area of the sealing resin layer 4 can be easily manufactured.

(Variations of Shape of Groove)

Figure 4A:
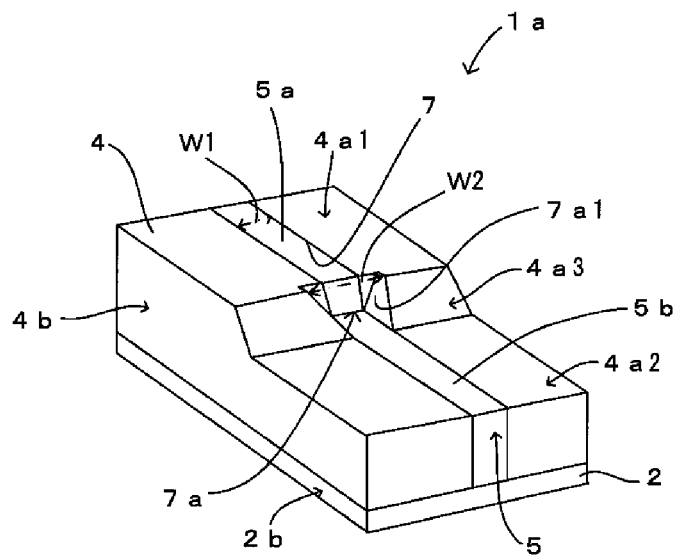
FIGS. 4A and 4B include illustrations of variations of the shape of a groove.
Figure 4B:
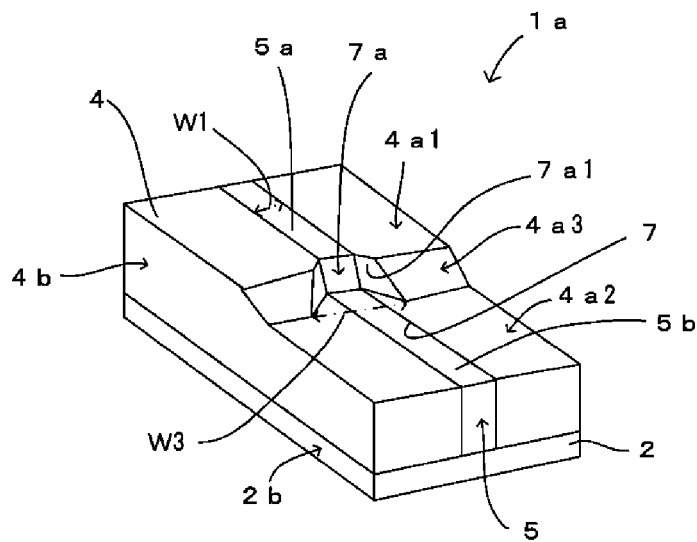

Next, variations of the groove 7 for forming the shielding wall 5 are described with reference to FIGS. 4A and 4B. FIGS. 4A and 4B are perspective views of the module 1a and illustrate variations of the shape of the groove. In FIGS. 4A and 4B, the shielding film 6 is not illustrated.

The groove 7 may be formed such that widths W2 and W3 of the unfilled region 7a, which is not filled with the conductive paste, are wider than width W1 of the region other than the unfilled region 7a. With this configuration, the wall surface 7a1 defining the unfilled region 7a can be easily covered with the shielding film 6. FIG. 4A illustrates the case where the width W2 of the groove in the unfilled region 7a increases from the lower portion side toward the higher portion side of the sealing resin layer 4. FIG. 4B illustrates the case where the width W3 of the groove in the unfilled region 7a increases from the higher portion side toward the lower portion side of the sealing resin layer 4.

(Variations of Shape of Stepped Area)

Figure 5A:
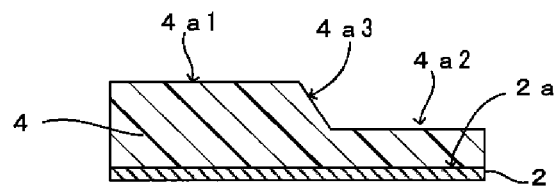
FIGS. 5A to 5F include illustrations of variations of the shape of a stepped area in a sealing resin layer.

Next, variations of the stepped area in the upper surface 4a of the sealing resin layer 4 are described with reference to FIGS. 5A to 5F and 6. FIGS. 5A to 5F are cross-sectional views in a direction perpendicular to the upper surface 2a of the wiring substrate 2 and intersecting the stepped area in the sealing resin layer 4. FIG. 6 is a plan view of the radio frequency module 1a in a variation. In FIGS. 5A to 5F, the configuration other than the sealing resin layer 4 and wiring substrate 2 is not illustrated. In FIG. 6, the shielding film 6 is not illustrated.

The shape of the stepped area in the sealing resin layer 4 may be changed. For example, as illustrated in FIG. 5A, the stepped area in the sealing resin layer 4 may be inclined from the higher portion side (higher surface 4a1) toward the lower portion side (lower surface 4a2). With this shape, for example, when the stepped area in the sealing resin layer 4 is formed by using a mold, the sealing resin layer 4 can be easily removed from the mold.

Figure 5B:
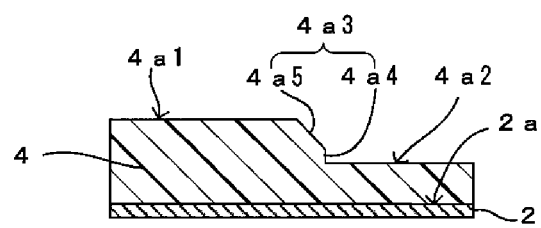
Figure 6:
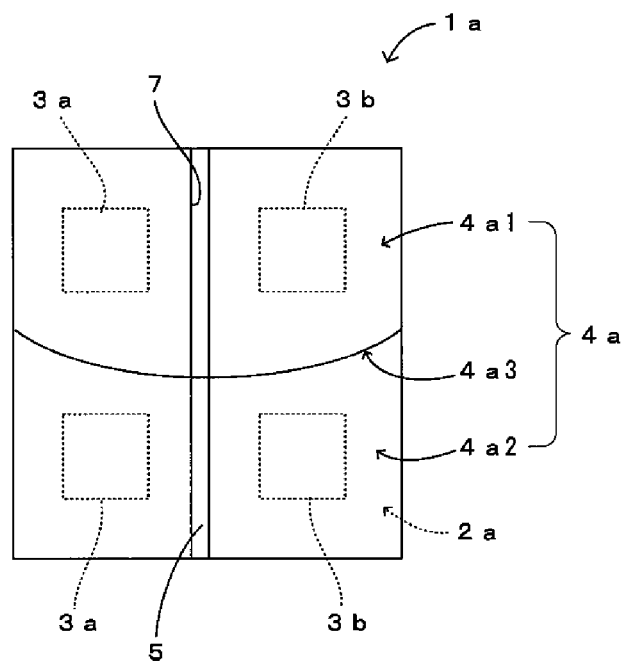
FIG. 6 illustrates another variation of the shape of the stepped area in the sealing resin layer.

As illustrated in FIG. 5B, the stepped area in the sealing resin layer 4 may have a shape in which a stepped corner portion is chamfered. In this case, a stepped surface 4a3 includes a first surface 4a4 rising from the lower surface 4a2 and a slope (second surface 4a5) connecting the top end of the first surface 4a4 and the higher surface 4a1. With this configuration, the removal of the sealing resin layer 4 from the mold can be facilitated, and the size of the lower surface 4a2 of the sealing resin layer 4 can be increased.

Figure 5C:
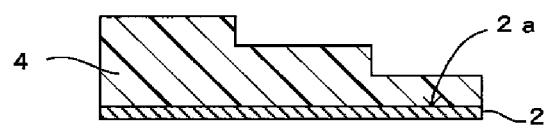
Figure 5D:
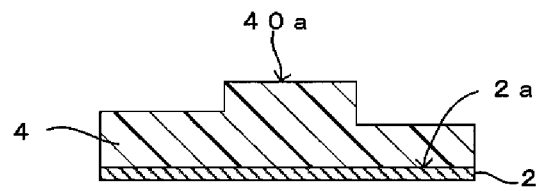
Figure 5E:
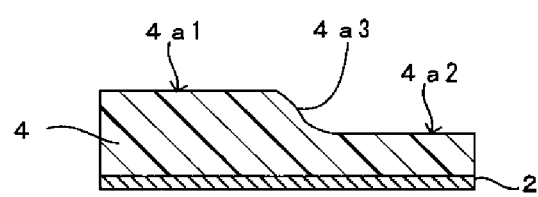
Figure 5F:
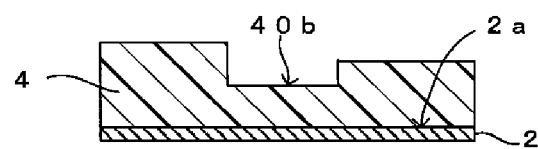

As illustrated in FIG. 5C, the sealing resin layer 4 may have a plurality of stepped areas. As illustrated in FIG. 5D, the stepped area may have a shape including a protrusion 40a. As illustrated in FIG. 5E, the stepped surface 4a3 may have a curved shape gently connecting the higher surface 4a1 and lower surface 4a2. As illustrated in FIG. 5F, the stepped area may have a shape including a depression 40b. As illustrated in FIG. 6, the stepped area in the sealing resin layer 4 may be curved when the wiring substrate 2 is seen in plan view. In this case, the stepped area in the sealing resin layer 4 may have a curved shape in part in plan view.

<Second Embodiment>

Figure 7:
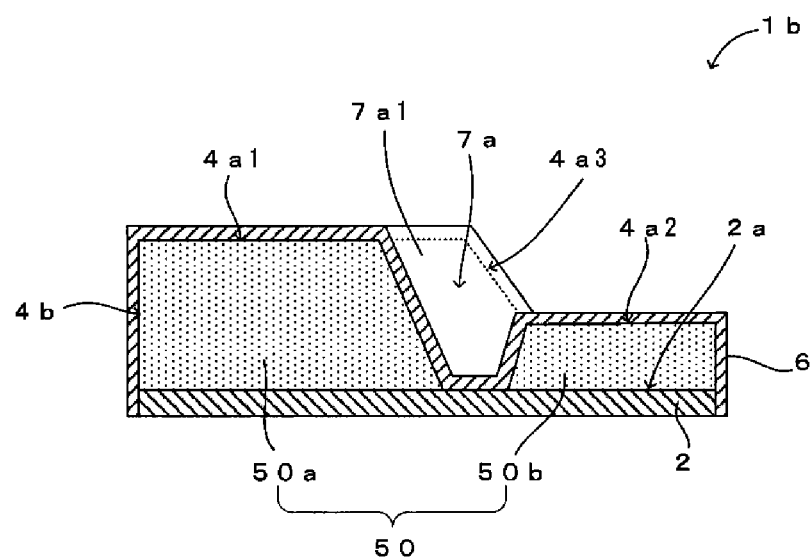
FIG. 7 illustrates a radio frequency module according to a second embodiment of the present disclosure.

Next, a radio frequency module 1b according to a second embodiment of the present disclosure is described with reference to FIG. 7. FIG. 7 illustrates the radio frequency module 1b and corresponds to a cross-sectional view taken along the line A-A with arrows in FIG. 2.

The radio frequency module 1b according to the present embodiment is different from the radio frequency module 1a in the first embodiment described with reference to FIGS. 1 and 2 in that, as illustrated in FIG. 7, the stepped area in the sealing resin layer 4 has a different shape and a shielding wall 50 with a different configuration is included. The other configurations are the same as in the radio frequency module 1a according to the first embodiment, bear the same reference numerals, and are not described here.

In this case, the stepped area in the sealing resin layer 4 includes the higher surface 4a1, lower surface 4a2, and the slope (stepped surface 4a3) connecting the higher surface 4a1 and lower surface 4a2. The shielding wall 50 is formed such that a portion 50a on the higher portion side of the sealing resin layer 4 (hereinafter referred to as higher portion 50a) and a portion 50b on the lower portion side thereof (hereinafter referred to as lower portion 50b) are arranged separately, and the unfilled region 7a, which is empty of the conductive paste, is formed between the portions 50a and 50b. At this time, the higher portion 50a of the shielding wall 50 is formed so as to have the same height as that of the higher surface 4a1 of the sealing resin layer 4, and the lower portion 50b is formed so as to have the same height as that of the lower surface 4a2 of the sealing resin layer 4. The shielding film 6 covers the upper surface 4a and peripheral side surface 4b of the sealing resin layer 4 and the side surface 2b of the wiring substrate 2 and also covers the wall surface 7a1 defining the unfilled region 7a of the groove 7.

(Method for Manufacturing Radio Frequency Module 1b)

Next, a method for manufacturing the radio frequency module 1b is described. The process up to the preparation step is the same as that in the method for manufacturing the radio frequency module 1a according to the first embodiment, and subsequent steps are described here.

After the component-sealed structure is formed, the shielding wall 50 is formed (shielding wall forming step). In this case, of the groove 7, a portion extending to near the stepped area on the higher portion side of the stepped area in the sealing resin layer 4 and a portion extending to near the stepped area on the lower portion side of the stepped area are formed by laser processing (fifth step).

Next, after both the portions of the groove 7 are filled with the conductive paste, the conductive paste is solidified and the shielding wall 50 including the higher portion 50a and lower portion 50b arranged separately is formed (sixth step). Then, the remaining portion of the groove 7 other than the portions formed in the fifth step is formed by laser processing (seventh step). At this time, to join the groove 7 with reliability, both of the higher portion 50a and lower portion 50b of the shielding wall 50 may be cut slightly.

Next, the shielding film 6 is formed by using a film deposition technique, and the radio frequency module 1b is completed (shielding film forming step). At this time, the shielding film 6 covers the upper surface 4a and peripheral side surface 4b of the sealing resin layer 4 and the side surface 2b of the wiring substrate 2 and also covers the wall surface 7a1 defining the remaining portion of the groove 7 (portion between the higher portion 50a and lower portion 50b of the groove 7).

According to the present embodiment, in some instances substantially the same advantages as in the radio frequency module 1a according to the first embodiment can be obtainable. In the formation of the shielding wall 50, the higher portion 50a and the lower portion 50b can be filled with the conductive paste at a time, and thus the number of steps can be reduced.

<Third Embodiment>

Figure 8A:
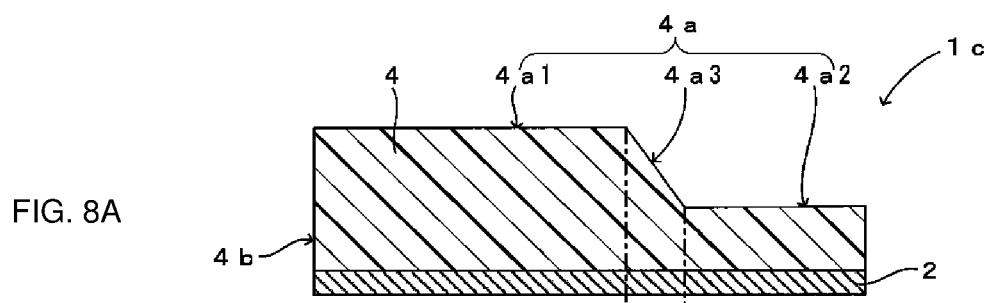
FIGS. 8A and 8B include illustrations of a radio frequency module according to a third embodiment of the present disclosure.
Figure 8B:
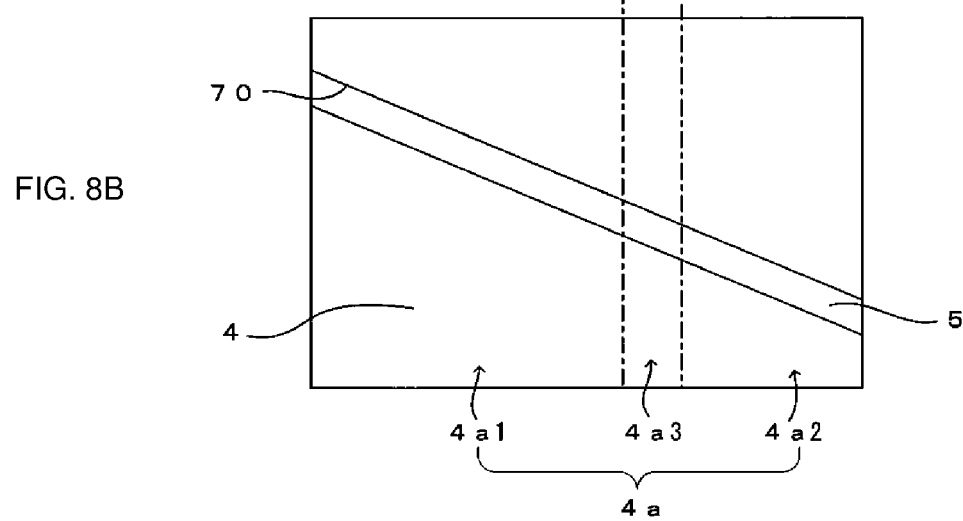

Next, a radio frequency module 1c according to a third embodiment of the present disclosure is described with reference to FIGS. 8A and 8B. FIG. 8A is a cross-sectional view that illustrates the shape of the stepped area in the wiring substrate 2. FIG. 8B is a plan view of the radio frequency module 1c. In FIG. 8A, only the wiring substrate 2 and sealing resin layer 4 are illustrated. In FIG. 8B, only the sealing resin layer 4, shielding wall 5, and a groove 70 are illustrated.

The radio frequency module 1c according to the present embodiment is different from the radio frequency module 1a in the first embodiment described with reference to FIGS. 1 and 2 in that, as illustrated in FIGS. 8A and 8B, the stepped area in the upper surface 4a of the sealing resin layer 4 includes the higher surface 4a1, lower surface 4a2, and stepped surface 4a3 inclined from the higher portion side (higher surface 4a1) toward the lower portion side (lower surface 4a2) and in that it includes the groove 70 in the shielding wall 5 with a different configuration. The other configurations are the same as in the radio frequency module 1a according to the first embodiment, bear the same reference numerals, and are not described here.

In this case, the groove 70 for forming the shielding wall 5 is arranged so as to obliquely intersect the stepped area in the sealing resin layer 4 when the wiring substrate 2 is seen in plan view. With this configuration, the degree of freedom in design, such as the degree of freedom of arrangement of the components 3a and 3b in the radio frequency module 1c, can be improved.

<Fourth Embodiment>

Figure 9:
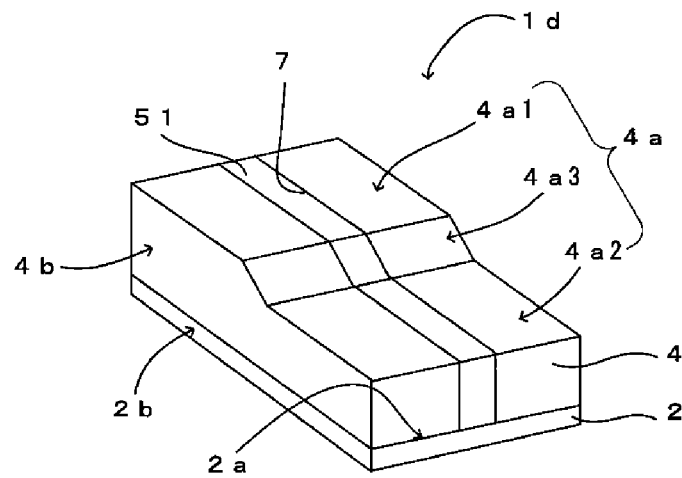
FIG. 9 is a perspective view of a radio frequency module according to a fourth embodiment of the present disclosure.
Figure 10:
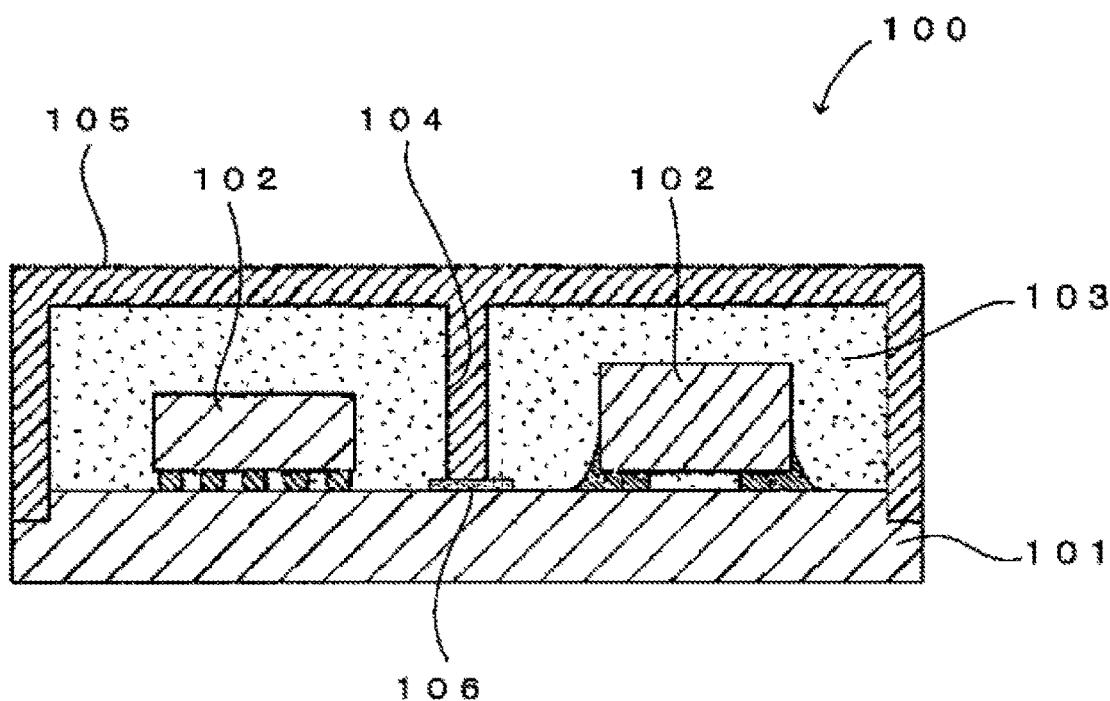
FIG. 10 is a cross-sectional view of a traditional radio frequency module.

Next, a radio frequency module 1d according to a fourth embodiment of the present disclosure is described with reference to FIG. 9. FIG. 9 is a perspective view of the radio frequency module 1d without the shielding film 6.

The radio frequency module 1d according to the present embodiment is different from the radio frequency module 1a in the first embodiment described with reference to FIGS. 1 and 2 in that, as illustrated in FIG. 9, the stepped area in the upper surface 4a in the sealing resin layer 4 includes the higher surface 4a1, lower surface 4a2, and stepped surface 4a3 inclined from the higher portion side (higher surface 4a1) toward the lower portion side (lower surface 4a2) and in that it includes a shielding wall 51 with a different configuration. The other configurations are the same as in the radio frequency module 1a according to the first embodiment, bear the same reference numerals, and are not described here.

In this case, the shielding wall 51 is formed by fully filling the groove 7 with the conductive paste. In other words, the unfilled region 7a in the first embodiment is not formed in the groove 7, and the shielding wall 51 is formed such that its upper surface is flush with the upper surface 4a of the sealing resin layer 4. With this manner, unlike the radio frequency module 1a, it is not necessary to cover the wall surface 7a1 defining in the unfilled region 7a of the groove 7 with the shielding film 6, and the shielding film 6 can be formed easily.

The present disclosure is not limited to the embodiments described above, and various changes other than the above-described embodiments can be made without departing from the spirit and principle thereof. For example, the configurations in the above-described embodiments and variations may be combined.

The shielding walls 5, 50, and 51 in the above-described embodiments are described as being linear as seen in plan view, and they may include a bent section.

INDUSTRIAL APPLICABILITY

The present disclosure is applicable to various radio frequency modules each including a sealing resin layer covering a plurality of components mounted on a wiring substrate and a shielding wall for preventing mutual interference of noise between the components.

REFERENCE SIGNS LIST 1a to 1d radio frequency module
2 wiring substrate
2a upper surface (principal surface)
3a, 3b component
4 sealing resin layer
4a upper surface (opposite surface)
5, 50, 51 shielding wall
5a higher portion (first portion)
5b lower portion (second portion)
6 shielding film
7 groove
7a unfilled region
7b section
7c remaining portion

What is claimed is:

1. A radio frequency module comprising:
a wiring substrate;
a plurality of components mounted on a principal surface of the wiring substrate;
a sealing resin layer laminated on the principal surface of the wiring substrate and covering the plurality of components;
a groove provided in the sealing resin layer and extending between a component and another component of the plurality of components; and
a shielding wall made of a conductor and arranged in the groove,
wherein the sealing resin layer has a stepped area in an opposite surface of the sealing resin layer that is opposed to a surface of the sealing resin layer that is in direct contact with the principal surface of the wiring substrate, and
the groove intersects the stepped area when the wiring substrate is seen in plan view,
wherein the stepped area comprises a higher surface, a lower surface and a stepped surface that links the higher surface to the lower surface.

2. The radio frequency module according to claim 1, wherein the shielding wall includes a first portion in which a portion of the groove on a higher portion side of the stepped area in the sealing resin layer, the portion ending before the stepped area and not reaching the stepped area, is filled with the conductor up to a height of the higher portion and a second portion in which a remaining portion of the groove on the higher portion side of the stepped area is filled with the conductor up to a height of a lower portion of the stepped area, and
the groove has an unfilled region not filled with the conductor, the unfilled region being defined by a stepped area of the first portion and a top surface of the remaining portion of the groove filled with the conductor up to the height of the lower portion of the stepped area in the second portion of the shielding wall.

3. The radio frequency module according to claim 2, further comprising a shielding film that covers at least the opposite surface of the sealing resin layer and a wall surface defining the unfilled region of the groove.

4. The radio frequency module according to claim 3, wherein a width of the unfilled region of the groove is wider than a width of a portion of the groove other than the unfilled region when viewed in a direction perpendicular to the principal surface of the wiring substrate.

5. The radio frequency module according to claim 3, wherein the stepped area is inclined from the higher portion toward the lower portion.

6. The radio frequency module according to claim 2, wherein a width of the unfilled region of the groove is wider than a width of a portion of the groove other than the unfilled region when viewed in a direction perpendicular to the principal surface of the wiring substrate.

7. The radio frequency module according to claim 6, wherein the stepped area is inclined from the higher portion toward the lower portion.

8. The radio frequency module according to claim 2, wherein the stepped area is inclined from the higher portion toward the lower portion.

9. The radio frequency module according to claim 2, wherein the stepped area has a shape in which a stepped corner portion is chamfered.

10. The radio frequency module according to claim 1, wherein the shielding wall is provided by fully filling the groove with the conductor.

11. The radio frequency module according to claim 10, wherein the stepped area is inclined from the higher portion toward the lower portion.

12. The radio frequency module according to claim 1, wherein the stepped area is inclined from the higher portion toward the lower portion.

13. The radio frequency module according to claim 1, wherein the stepped area has a shape in which a stepped corner portion is chamfered.

14. The radio frequency module according to claim 1, wherein the groove and the stepped area obliquely intersect with each other in the plan view.

15. The radio frequency module according to claim 1, wherein the stepped area in the sealing resin layer is curved in the plan view.

16. The radio frequency module according to claim 1, further comprising a shielding film that covers at least the opposite surface of the sealing resin layer,
wherein the shielding wall includes a portion on a higher portion side of the stepped area and a portion on a lower portion side thereof, both of the portions being arranged separately, and
the shielding film further covers a wall surface defining the groove between the portion on the higher portion side and the portion on the lower portion side of the shielding wall.

17. The radio frequency module according to claim 1, wherein the lower surface is substantially parallel with the higher surface, the stepped surface extends in a direction perpendicular to the higher surface and the lower surface, and
the higher surface is provided on an outermost surface of the sealing resin layer that is opposite to the surface of the sealing resin layer that is in direct contact with the principal surface of the wiring substrate, and the lower surface is closer to the principal surface of the wiring substrate than the higher surface.

18. A method for manufacturing a radio frequency module, the method comprising:
a preparation step of preparing a component-sealed structure including a wiring substrate, a plurality of components mounted on a principal surface of the wiring substrate, and a sealing resin layer laminated on the principal surface of the wiring substrate and covering the plurality of components, the sealing resin layer having a stepped area in an opposite surface of the sealing resin layer that is opposed to a surface of the sealing resin layer that is in direct contact with the principal surface of the wiring substrate;
a shielding wall forming step of forming a groove in the sealing resin layer, the groove extending between a component and another component of the plurality of components and intersecting the stepped area when the wiring substrate is seen in plan view, and of forming a shielding wall in the groove; and
a shielding film forming step of forming a shielding film that covers at least the opposite surface of the sealing resin layer by using a film deposition technique,
wherein the shielding wall forming step includes
a first step of forming a section of the groove in the opposite surface of the sealing resin layer on a higher portion side of the stepped area by laser processing, the section extending to near the stepped area, a
second step of forming a first portion of the shielding wall by filling the section of the groove formed in the first step with conductive paste,
a third step of forming a remaining portion of the groove by laser processing, and
a fourth step of forming a second portion of the shielding wall by inserting the conductive paste into the remaining portion of the groove up to a height of a lower portion side of the stepped area in the sealing resin layer and of forming an unfilled region not filled with the conductive paste in the groove, and
in the shielding film forming step, the shielding film covers a wall surface defining the unfilled region of the groove, together with the opposite surface of the sealing resin layer.

19. A method for manufacturing a radio frequency module, the method comprising:
a preparation step of preparing a component-sealed structure including a wiring substrate, a plurality of components mounted on a principal surface of the wiring substrate, and a sealing resin layer laminated on the principal surface of the wiring substrate and covering the plurality of components, the sealing resin layer having a stepped area in an opposite surface of the sealing resin layer that is opposed to a surface of the sealing resin layer that is in direct contact with the principal surface of the wiring substrate;
a shielding wall forming step of forming a groove in the sealing resin layer, the groove extending between a component and another component of the plurality of components and intersecting the stepped area when the wiring substrate is seen in plan view, and of forming a shielding wall in the groove; and
a shielding film forming step of forming a shielding film that covers at least the opposite surface of the sealing resin layer by using a film deposition technique,
wherein the shielding wall forming step includes
a fifth step of forming a portion of the groove extending to near the stepped area on a higher portion side of the stepped area and a portion of the groove extending to near the stepped area on a lower portion side of the stepped area by laser processing, a sixth step of forming the shielding wall including a portion on the higher portion side of the sealing resin layer and a portion on the lower portion side thereof, both of the portions being arranged separately, by filling the portion of the groove extending to near the stepped area on the higher portion side and the portion of the groove extending to near the stepped area on the lower portion side with conductive paste, and a seventh step of forming a remaining portion of the groove other than the portions formed in the fifth step by laser processing, and in the shielding film forming step, the shielding film covers a wall surface defining the remaining portion of the groove, together with the opposite surface of the sealing resin layer.

\* \* \* \* \*

UNITED STATES PATENT AND TRADEMARK OFFICE
CERTIFICATE OF CORRECTION

PATENT NO. : 10,546,820 B2
APPLICATION NO. : 15/852019
DATED : January 28, 2020
INVENTOR(S) : Yoshihisa Masuda et al.

It is certified that error appears in the above-identified patent and that said Letters Patent is hereby corrected as shown below:

In the Specification

Column 14, Line 28, "a" should be the start of a new paragraph

Signed and Sealed this
Twenty-second Day of September, 2020

Andrei Iancu
*Director of the United States Patent and Trademark Office*